(12) United States Patent
Worledge (10) Patent No.: US 7,002,194 B2
(45) Date of Patent: Feb. 21, 2006

(54) VIA AP SWITCHING (75) Inventor: Daniel Worledge, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 243 days.

(21) Appl. No.: 10/622,350

(22) Filed: Jul. 18, 2003

(65) Prior Publication Data

US 2005/0012127 A1    Jan. 20, 2005

(51) Int. Cl.
*H01L 29/76* (2006.01)
*G11C 11/00* (2006.01)

(52) U.S. Cl. ............... 257/295; 247/E21.167; 247/E21.323; 247/E21.665; 365/158; 365/173; 438/3

(58) Field of Classification Search ............... 257/295; 438/3; 365/158
See application file for complete search history.

(56) References Cited

U.S. PATENT DOCUMENTS 5,600,297 A * 2/1997 Ruigrok et al. ........... 338/32 R
6,661,703 B1 * 12/2003 Ikeda ...................... 365/158
6,767,655 B1 * 7/2004 Hiramoto et al. .......... 428/692
2003/0099869 A1 * 5/2003 Oikawa et al. ...... 428/690 TM
2003/0157368 A1 * 8/2003 Nguyen Van Dau et al. .... 428/692

* cited by examiner

*Primary Examiner*—Ngân V. Ngô
*Assistant Examiner*—Long Tran
(74) *Attorney, Agent, or Firm*—Michael J. Buchenhorner; Wan Yee Cheung; Holland & Knight LLP (57) ABSTRACT

A magnetic storage structure comprises a first magnetic layer; a second magnetic layer; and a nonmagnetic spacer layer disposed between the first and second layers for coupling the first and second layers to be parallel in a zero field condition. According to another embodiment of the invention a magnetic memory cell exhibits a hysteresis loop wherein in small fields the thin layer switches, reversibly, leaving the layers coupled anti parallel. At larger fields the thick layer switches making the layers parallel. According to yet another embodiment of the invention, a magnetic memory structure comprises two magnetic layers wherein the layers are magnetically coupled in a substantially parallel mode in zero field, and switches via the anti parallel state.

18 Claims, 8 Drawing Sheets

FIG. 1A
(PRIOR ART)

WORDLINE

TOP VIEW:

FIG. 2B
(AMENDED)

SIDE VIEW:

FIG. 3

VIA AP ASTROID FOR MEDIA (t1=t2)

AVAP ASTROID $$H_a = \frac{J}{M_s} \frac{t_1+t_2}{t_1 t_2} - 4\pi M_s \frac{(t_1+t_2)}{b} n_x$$

$$H_b = 4\pi M_s \frac{(t_1-t_2)}{b} (n_y - n_x)$$

$$H_y = 4\pi M_s \frac{(t_1+t_2)}{b} (n_y - n_x)$$

FIG. 8A

EASY

HYSTERESIS LOOP

FIG. 8B

EASY AXIS FIELD

ASTROID

FIG. 9

EXPERIMENTAL DATA

EASY

HYSTERESIS LOOP

VIA AP SWITCHING

FIELD OF THE INVENTION

The invention disclosed broadly relates to the field of magnetic storage of information and more particular to storage of information in Magnetic Random Access Memory ("MRAM") and media for mass storage devices.

BACKGROUND OF THE INVENTION

Magnetic Storage Media

Figure 1A:
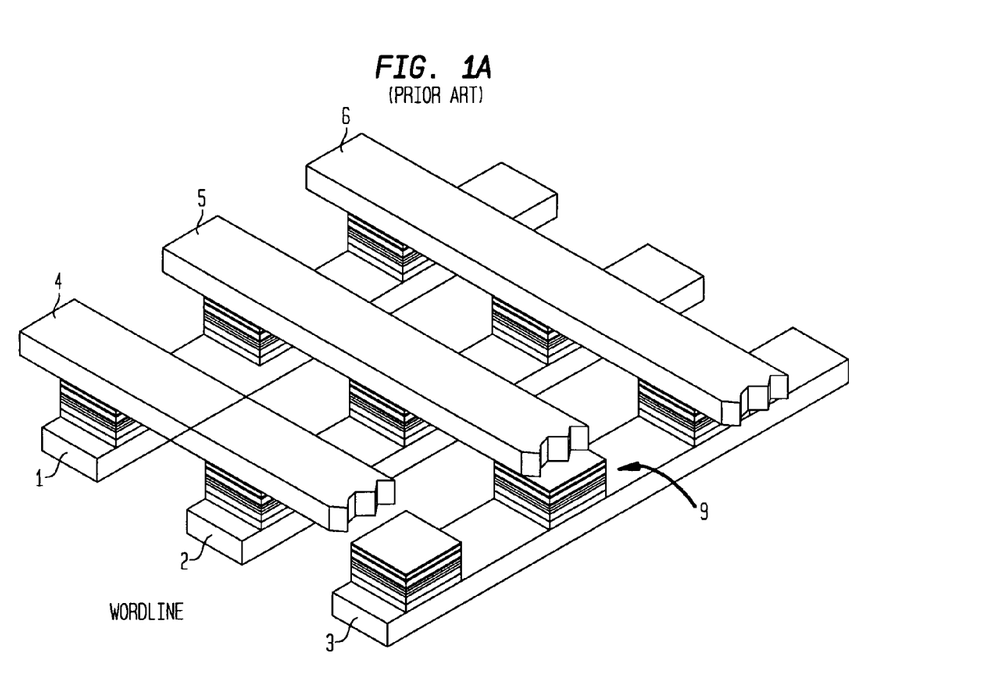
FIGS. 1a and 1b illustrate a prior art MRAM cell.

Magnetic storage media are well known. Media for hard disk drives and MRAM are among the most common forms of magnetic storage media. Referring to FIG. 1a, there is shown an MRAM array according to the prior art. The array includes a set of electrically conductive traces that function as parallel word lines 1, 2, and 3 in a horizontal plane, and a set of electrically conductive traces that function as parallel bit lines 4, 5, and 6 in another horizontal plane. The bit lines are oriented in a different direction, preferably at right angles to the word lines, so that the two sets of lines intersect when viewed from above. While not shown in FIG. 1a, the array is formed on a substrate, such as a silicon substrate on which there would be other circuitry. Also, a layer of insulating material is located between the bit lines and word lines at regions of the MRAM other than the intersecting regions. Three word lines and three bit lines are illustrated in FIG. 1a, but the number of lines would typically be much larger.

Figure 1B:
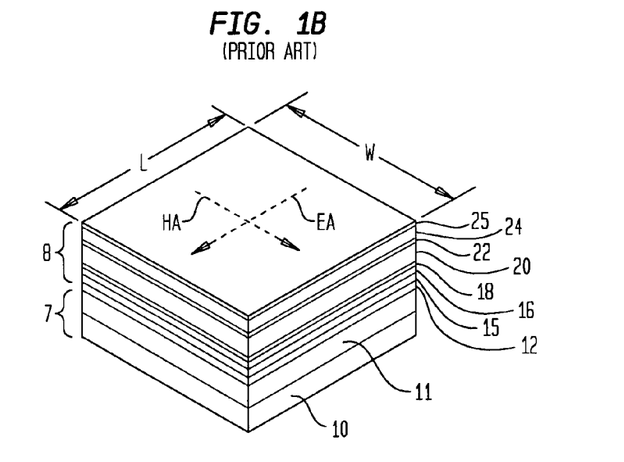

Referring to FIG. 1b, there is shown an MRAM cell 9 that includes a magnetic tunnel junction (MTJ) 8. The MTJ comprises a magnetically changeable or free region 24, and a proximate magnetic reference region 20, arranged into the MTJ device 8. The principle underlying storage of data in such cells is the ability to change the relative orientation of the magnetization of the free and reference regions by changing the direction of magnetization along the easy axis ("EA") of the free region, and the ability to thereafter read this relative orientation difference.

The memory cell 9 is located at each crossing point of the word lines and bit lines in the intersection region vertically spaced between the lines. During operation of the array, current flows in a vertical direction through the cell 9. The vertical current path through the memory cell permits the memory cell to occupy a very small surface area.

The structure of the memory cell 9 is described in more detail with reference to FIG. 1b. The memory cell 9 is formed on and in contact with a word line 3 (FIG. 1a). The MTJ 8 is formed as a series of layers of material stacked one on top of the other. The MTJ 8 possibly comprises a template layer 15, such as Pt, an initial ferromagnetic layer 16, such as permalloy (Ni—Fe), an antiferromagnetic layer (AF) 18, such as Mn—Fe, a fixed ferromagnetic layer (FMF) 20, such as Co—Fe or permalloy, a thin tunneling barrier layer 22 of alumina ($Al_2O_3$), a soft ferromagnetic layer (FMS) 24, such as a sandwich of thin Co—Fe with permalloy, and a contact layer 25, such as Pt.

The FMS layer 24 is fabricated to have a preferred axis for the direction of magnetization called the easy axis. There are two possible directions of magnetization of the FMS layer along this easy axis, which defines the two states of the memory cell. In contrast, the FMF layer 20 is fabricated to have only one preferred direction of magnetization, called its unidirectional anisotropy direction, and this direction is parallel to the easy axis of the FMS layer 24. The desired easy axis for the FMS layer 24 is set by some combination of intrinsic anisotropy, strain-induced anisotropy and shape anisotropy of the MTJ 8. The MTJ 8 and FMS 24 are possibly made in the shape of a rectangle of length L and width W, where L is larger than W (FIG. 1b). However, other shapes such as an ellipse are also possible. The magnetic moment of FMS 24 prefers to align along the direction of L.

More particularly, an MRAM cell is written by reversing the free region magnetization using applied bi-directional electrical and resultant magnetic stimuli via its respective bitline and wordline, and is later read by measuring the resultant tunneling resistance between the bitline and wordline, which assumes one of two values depending on the relative orientation of the magnetization of the free region with respect to the reference region. (The term reference region is used broadly herein to denote any type of region which, in cooperation with the free or changeable region, results in a detectable state of the device as a whole.) If the free region is modeled as a simple elemental magnet having a direction of magnetization which is free to rotate but with a strong preference for aligning in either direction along its easy axis (+EA or −EA), and if the reference region is a similar elemental magnet but having a direction of magnetization fixed in the +EA direction, then two states (and therefore the two possible tunneling resistance values) are defined for the cell: aligned (+EA/+EA) and anti-aligned (−EA/+EA).

Magnetic Bits

MRAM and media for disk drives both use magnetic bits to store information. The bit is typically a submicron piece of magnetic material. For example, in MRAM the free layer of the tunnel junction is the magnetic bit; it can be an ellipse 300 nm×600 nm in area and 5 nm thick. The information is stored as the direction of magnetization of the bit, either pointing right or left, to store '1' or '0'. When the bit is in a zero applied magnetic field state, its magnetization is stable pointing either right or left. The application of a magnetic field can switch it from right to left and vice versa, to write information into the bit. Clearly, one of the important requirements for data storage is that the bit not change direction when there is no, or only a small, applied field. This is complicated for MRAMs because the bit is often affected by a small field (called a half-select field) during operation when other bits are being written. The bits must not change direction during such a half select. Unfortunately, in practice, bits do change direction unintentionally, because of thermal activation. This means that thermal energy from the environment helps the bit over the activation energy barrier, Ea, to change direction. This thermal activation process must be minimized. The resulting error rate due to thermally activated switching is called the soft error rate (SER).

Scaling

As the area of each bit is made continually smaller in each generation of product (a process referred to as scaling because the bit area is scaled down to allow for more bits in the same area), the SER problem becomes worse. A quantity ($E_a$) describes the barrier height to thermal activation. It is desirable to have as large a barrier as possible, to prevent a given bit from activating over the barrier and thus changing direction unintentionally. According to single domain theory, $E_a$ is proportional to the volume of the bit. Therefore as the area is scaled down, if nothing else is changed, $E_a$ also goes down and so the SER quickly becomes unacceptably large. The simplest known solution is to increase the thickness of the cell as the area is scaled down, to maintain a large enough volume to keep $E_a$ large enough to avoid SER. However, this becomes a problem because a stronger magnetic field is required to switch a thick bit structure. The strength of field required to switch a bit is referred to as the coercivity, Hc. Therefore the goal of scaling is to make the area of the bit smaller while maintaining $E_a$ and Hc (preventing Ea from becoming too small and preventing Hc from becoming too large).

Writing Media versus MRAM

The difference between writing data to media and MRAM is that in media the bit is switched by applying an easy axis field only (easy axis means along the direction in which the magnetization tends to lie; the hard axis is perpendicular to this), and only one bit at a time feels the field; there are no half select fields. However in MRAM there is an array of bits and one bit is written to by sending currents down a row line and a column line. The bit at the intersection of these two lines feels both an easy and a hard axis field, and so switches. However, the non-selected bits on the column line only feel the easy axis field (half select field), and the non-selected bits on the row line only feel the hard axis field (half select field) and so these half selected bits do not switch. The curve in easy and hard fields which shows when the bit switches is called an astroid.

Figure 1C:
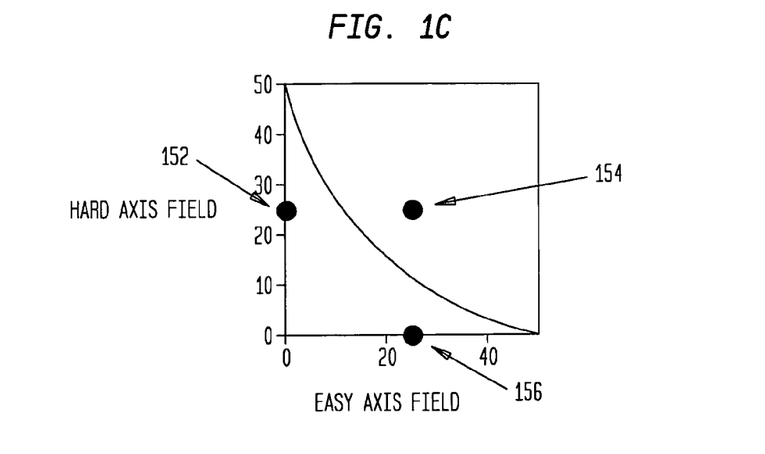
FIG. 1c shows a Stoner-Wohlfarth astroid.

Referring to FIG. 1c, there is shown an example of a Stoner-Wohlfarth (SW) astroid 150. The vertical axis represents the hard axis field strength and the horizontal axis represents the easy axis field. The points show the half and full select fields. For fields larger than the astroid, the bit switches, whereas for fields smaller than the astroid, the bit does not switch. For example, dot 152 represents a hard axis half select field. Dot 154 is in the full select field area and dot 156 is in the easy axis half select field. The goal therefore is to design a magnetic cell having an astroid so that the half select field lies within it and the full select field lies outside it. When the SER is taken into account, one finds that the astroid boundary needs to be even larger than the half select fields. This is because $E_a$ depends on the field; as the easy or hard axis field is increased, $E_a$ decreases. When the strength of the easy and hard axis fields reach the astroid boundary, $E_a$ has been reduced to zero. The astroid shape and the size of $E_a$ depend on the bit design. Known designs commonly use a single layer shaped like an ellipse. The single domain theory for this case is referred to as Stoner-Wohlfarth theory and the astroid shape is the Stoner-Wohlfarth astroid (shown in FIG. 1c).

In view of the foregoing discussion it is apparent that there is a need for improved designs that accomplish the desired switching characteristics and avoid the SER problem.

SUMMARY OF THE INVENTION

Briefly according to the invention a magnetic storage structure comprises a first magnetic layer; a second magnetic layer; and a nonmagnetic spacer layer disposed between the first and second layers for coupling the first and second layers to be parallel in a zero field condition.

According to another aspect of the invention a magnetic memory cell exhibits a hysteresis loop wherein in small fields the thin layer switches, reversibly, leaving the layers AP. At larger fields the thick layer switches making the layers P.

According to another aspect of the invention, a magnetic memory structure comprises two magnetic layers wherein the layers are magnetically coupled in a substantially parallel mode in zero field, and switches via the AP state.

DESCRIPTION OF PREFERRED EMBODIMENTS

We discuss a new type of magnetic bit design which exhibits a characteristic called via antiparallel (AP) switching that can be applied to both media used in hard disk mass storage and MRAM. In both applications a memory cell comprises first and second magnetic layers coupled via a non-magnetic layer.

Figure 2A:
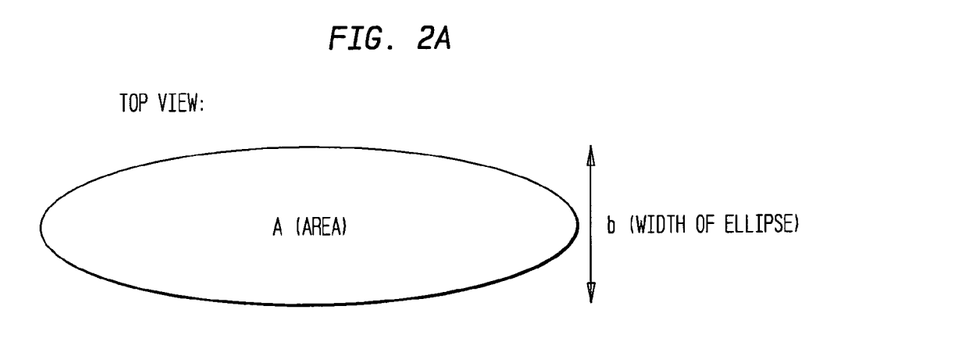
FIGS. 2a and 2b respectively show top and side views of a magnetic memory cell according to an embodiment of the invention.
Figure 2B:
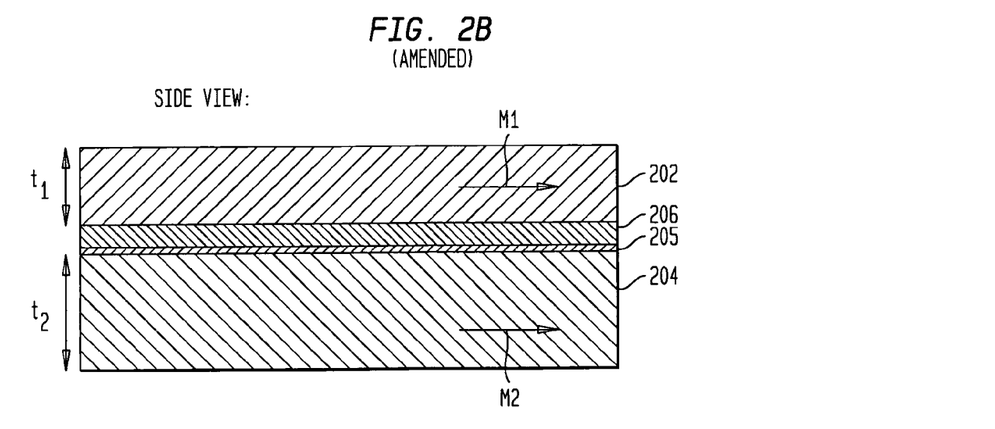

Referring to FIGS. 2a and 2b there are shown top and side views of a magnetic memory cell 200. In a first embodiment, the cell represents a memory cell in magnetic storage media such as a hard disk drive. In a second embodiment, the structure represents an MRAM cell. The magnetic memory cell comprises a first magnetic layer 202 and a second magnetic layer 204. The first layer 202 has a thickness $t_1$ and the second layer 204 has a thickness $t_2$. The first and second magnetic layers are weakly coupled via a nonmagnetic layer 206. In the media embodiment $t_1$ substantially equals $t_2$. By "substantially" we mean close enough to equal such that the switching characteristics discussed herein are present. In the MRAM embodiment $t_1$ is substantially greater less than $t_2$. An example of a substantial difference in thickness is where $t_2$ is 2 to 6 times $t_1$. In an embodiment, the nonmagnetic spacer layer 206 comprises a dusting layer 205 for reducing the coupling between layers 202 and 204.

The free layer of a media cell is replaced by two magnetic layers 202 and 204 which are weakly parallel coupled together via a nonmagnetic layer 206. The magnetic coupling is strong enough so that the magnetic fields of the two layers are parallel (P) in a zero field condition (i.e., absence of an external magnetic field) but weak enough that during switching of the magnetic field direction the layers are not parallel, and ideally become antiparallel (AP). The nonmagnetic layer is said to exchange couple the two magnetic layers 202 and 204 together. Such exchange coupled sandwiches are very well known. However known technological applications of such coupling have only been used where the coupling is large and AP. According to the invention small and P coupling is desired.

The applications of via AP switching to rotating media and MRAM differ in the relative thickness of the two magnetic layers. For rotating disk media they are substantially of equal thickness, whereas for MRAM their thicknesses are different by a factor of perhaps two to six times (hence the name "Asymmetric Via AP switching" or "AVAP"). The phrase "via AP" is used to refer to the case where the two layer thicknesses are the same (Media), and AVAP to refer to the case where they are different (MRAM).

Description of Via AP for Media

As discussed above, the via AP design is used for media. This case, where the two magnetic thicknesses are the same, is the simplest case. It is possible to provide an exact treatment of this case using single domain theory, as discussed below.

Consider the two layers being coupled together with positive coupling (favoring parallel coupling). According to this embodiment, the coupling between the layers is strong enough to couple the layers in parallel when they point in the easy axis direction, but weak enough so that the layers are anti-parallel when they point in the hard axis direction (in the absence of applied fields). Then these layers will switch via an antiparallel (AP) state. This leads to a large enhancement of the activation energy, while maintaining a constant Hc.

The energy is expressed as follows:

$$E = -\vec{\mu} \cdot \vec{H} - AJ \cos(\theta_1 - \theta_2)$$

$$E/A = -M_s H_x(t_1 \cos\theta_1 + t_2 \cos\theta_2) - M_s H_y(t_1 \sin\theta_1 + t_2 \sin\theta_2)$$

$$+ \tfrac{1}{2} M_s^2 [N_{x1} t_1 \cos^2\theta_1 + N_{x2} t_2 \cos^2\theta_2 + 2N_{x2} t_1 \cos\theta_1 \cos\theta_2]$$

$$+ \tfrac{1}{2} M_s^2 [N_{y1} t_1 \sin^2\theta_1 + N_{y2} t_2 \sin^2\theta_2 + 2N_{y2} t_1 \sin\theta_1 \sin\theta_2]$$

$$-J \cos(\theta_1 - \theta_2),$$

where $N_{x2} t_1 = N_{x1} t_2$ and similarly for y, and where $\theta_1$ represents the direction of the magnetic field of the first magnetic layer and $\theta_2$ represents the direction of the magnetic field of the second magnetic layer. This is reduced to $$e(\theta_1, \theta_2) = -h_x(z^{1/2}\cos\theta_1 + z^{-1/2}\cos\theta_2) - h_y(z^{1/2}\sin\theta_1 + z^{-1/2}\sin\theta_2) - \quad (1)$$
$$x\cos\theta_1\cos\theta_2 - y\sin\theta_1\sin\theta_2 + \frac{x-y}{2}[z\sin^2\theta_1 + z^{-1}\sin^2\theta_2],$$

where terms independent of angle are disregarded. The symbols have the following definitions:

$$e = \frac{Eb}{A 4\pi t_1 t_2 M_s^2} \qquad h_{x,y} = \frac{b H_{x,y}}{4\pi M_s \sqrt{t_1 t_2}}$$

$$x = \frac{Jb}{4\pi t_1 t_2 M_s^2} - n_x \qquad y = \frac{Jb}{4\pi t_1 t_2 M_s^2} - n_y$$

$$z = \frac{t_1}{t_2} \qquad N_{x,y/1,2} = \frac{4\pi t_{1,2} n_{x,y}}{b}$$

where b is the width of the ellipse, A is the area of the ellipse, $t_1$ and $t_2$ are the thicknesses of the two layers, J is the exchange coupling in ergs/cm$^2$, and $n_x$ and $n_y$ are the reduced demagnetizing factors ($n_x$=0.32 and $n_y$=0.9 for an aspect ratio of 2).

The layers will be parallel in zero field if $e(0,0)<e(0,\pi)$, i.e. if x>0. The layers will switch via the AP state if $e(\pi/2,-\pi/2)<e(\pi/2,\pi/2)$, i.e. if y<0. This requires $$\frac{4\pi t_1 t_2 M_s^2 n_x}{b} < J < \frac{4\pi t_1 t_2 M_s^2 n_y}{b}.$$

As a simple example, consider the case when no hard axis field is applied, and the two layer thicknesses are equal. Then it follows that $\theta_1 = -\theta_2 = \theta$. The energy becomes $$e = -2h_x \cos\theta - 2x \cos^2\theta.$$

The activation energy and the coercivity are easily calculated:

$$e_a = 2x \quad h_c = 2x.$$

These translate into $$E_a = 2A\left[J - \frac{4\pi t^2 n_x M_s^2}{b}\right] \quad H_c = \frac{2J - \frac{8\pi t^2 n_x M_s^2}{b}}{t M_s}. \quad (2)$$

An important aspect of equations (2) is that J can be chosen independently of t. This means that $E_a$ can be made large while keeping $H_c$ small. For example, given $H_{c0}$ and J, then choosing $$t = \frac{-\frac{M_s H_{c0}}{2} + \sqrt{\frac{M_s^2 H_{c0}^2}{4} + \frac{16\pi n_x M_s^2 J}{b}}}{8\pi n_x M_s^2 / b}$$

results in $$E = \frac{t}{t_0} E_{a0}.$$

When J is large, t is large, resulting in a large activation energy enhancement. Here $t_0$ is the thickness of a single layer with coercivity $H_{c0}$ and activation energy $E_{a0}$.

Description of Via AP for MRAM

Figure 3:
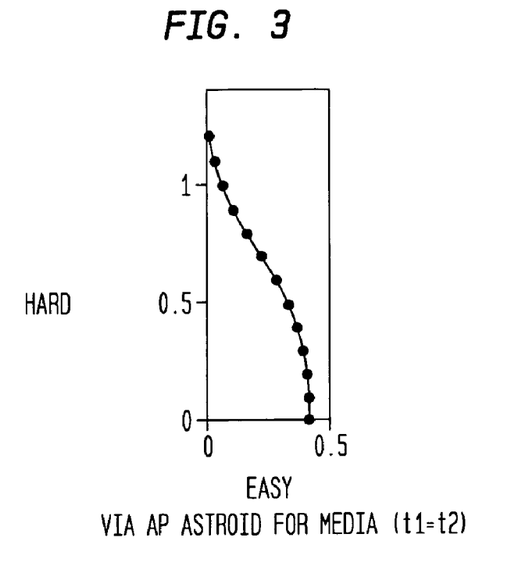
FIG. 3 shows a graph of a via AP astroid for media.
Figure 4:
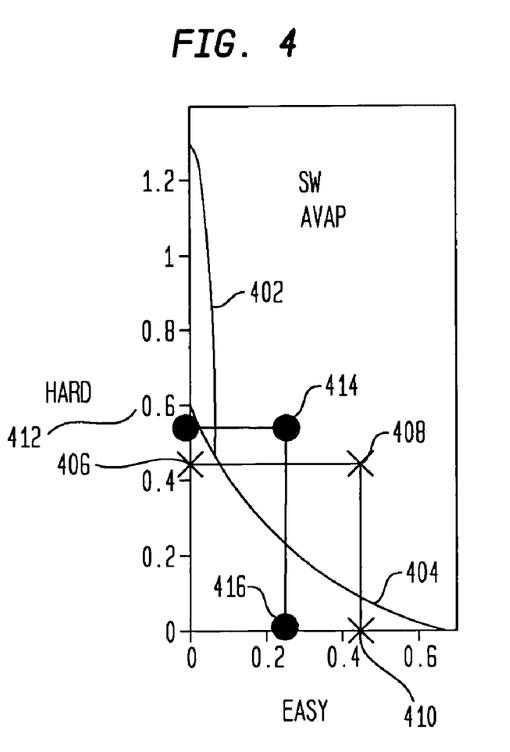
FIG. 4 is a graph showing the AVAP astroid and the Stoner-Wohlfarth asteroid.

Referring again to FIGS. 2a and 2b, there are shown top and side views of an MRAM cell 200 wherein first and second magnetic layers (202 and 204) coupled to each other via a nonmagnetic layer 206 have different thicknesses ($t_1$ and $t_2$). In this case layer 202 is a thin layer and layer 204 is the thick layer. The reason that the case where $t_1=t_2$ cannot be used for MRAM is that, while $E_a$ is large, the associated astroid does not have the right shape, as shown in FIG. 3. By making $t_2>t_1$ the astroid shape changes to a new type of shape which provides much better switching characteristics than the astroid shape used in the prior art. This astroid shape (herein called the AVAP astroid 402) is shown in FIG. 4, along with the Stoner-Wohlfarth astroid 404. The points each shown as an x (406–410) represent the Stoner-Wohlfarth characteristic. The round points (412–416) represent the AVAP characteristic. The AVAP astroid 402 shape has more curvature than the Stoner-Wohlfarth astroid 404. This allows the half select fields to be made smaller (relative to the tips of the astroid along the easy and hard axes) while still leaving the full select field outside of the astroid boundary. The smaller half select fields in turn produce a larger $E_a$. Therefore AVAP provides two distinct benefits: (1) Ea is larger in zero field and (2) smaller half select fields are used (relative to the tips of the astroid along the easy and hard axes), thus $E_a$ is reduced less than in the Stoner-Wohlfarth case. Both of these factors reduce the SER.

Phase Space where AVAP is Found

Figure 5:
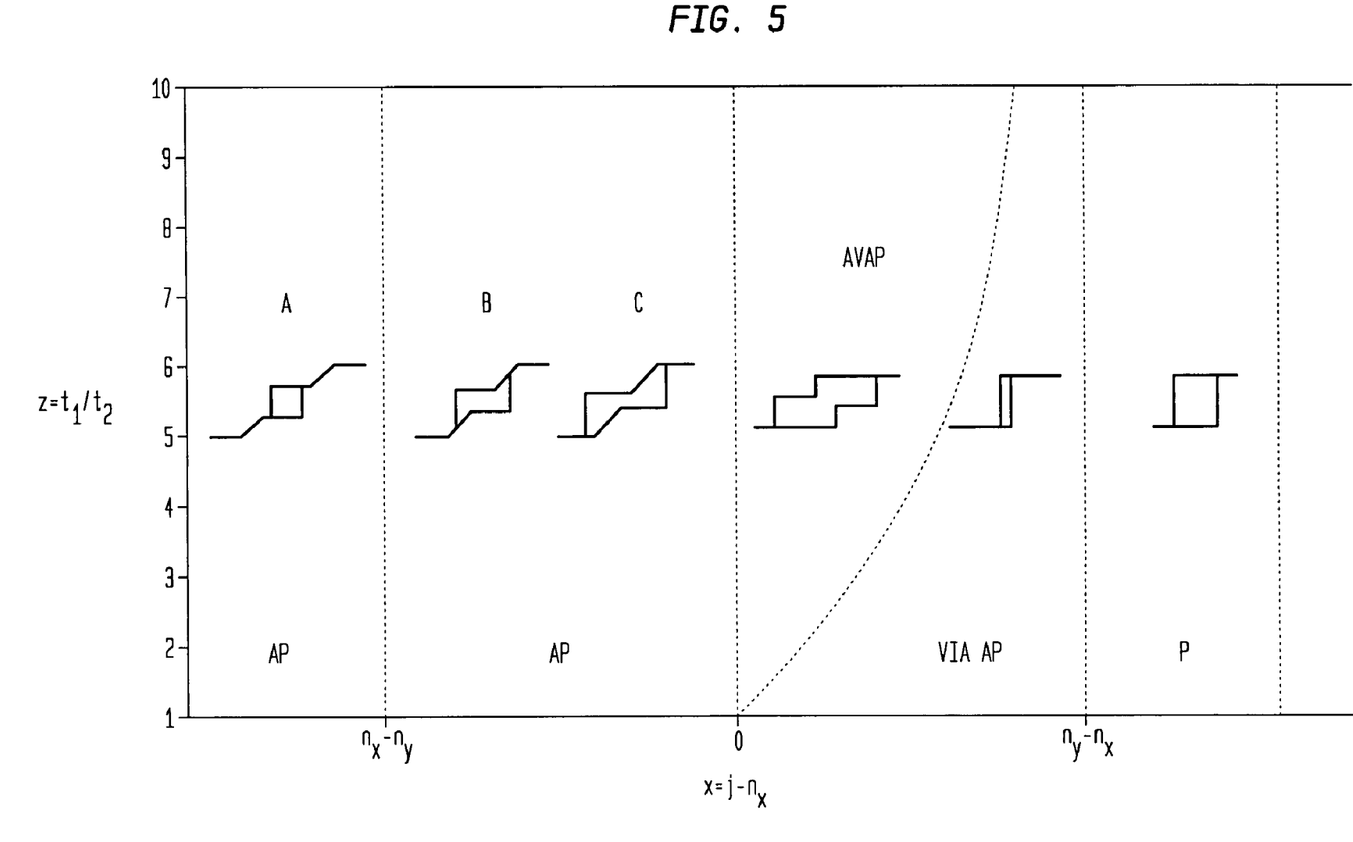
FIG. 5 is a phase diagram for two coupled magnetic layers.

Referring to FIG. 5, there is shown a phase diagram for the coupled layers. It is divided into four sections. There is a range of layer thicknesses and coupling strengths that result in AVAP, based on the single domain model, with the assumption that there is negligible intrinsic anisotropy. Including intrinsic anisotropy does not substantially change the following results. FIG. 5 shows where AVAP switching is found. The vertical axis represents the variable z, the thickness asymmetry, and the horizontal axis represents the variable x, the value of the reduced coupling strength, including demag, as defined above. One can see that when the value of x is too large the result is a simple hysteresis loop (P region). For large negative values of x the result is the well known AP region. This region is divided up into three sub-regions A, B, and C depending on the details of the shape of the hysteresis loop. In-between these regions is a small region where the layers are parallel in zero field, but switch via the AP state. In the region marked via AP, the layers switch dynamically through the AP state in one step. This is the via AP region of interest for media. In the region marked AVAP, the layers switch via the AP state in two steps. After the first step the layers are antiparallel, and after the second step they are parallel pointing in the opposite direction from where they started.

AVAP Hysteresis Loop and Astroid

Figure 6:
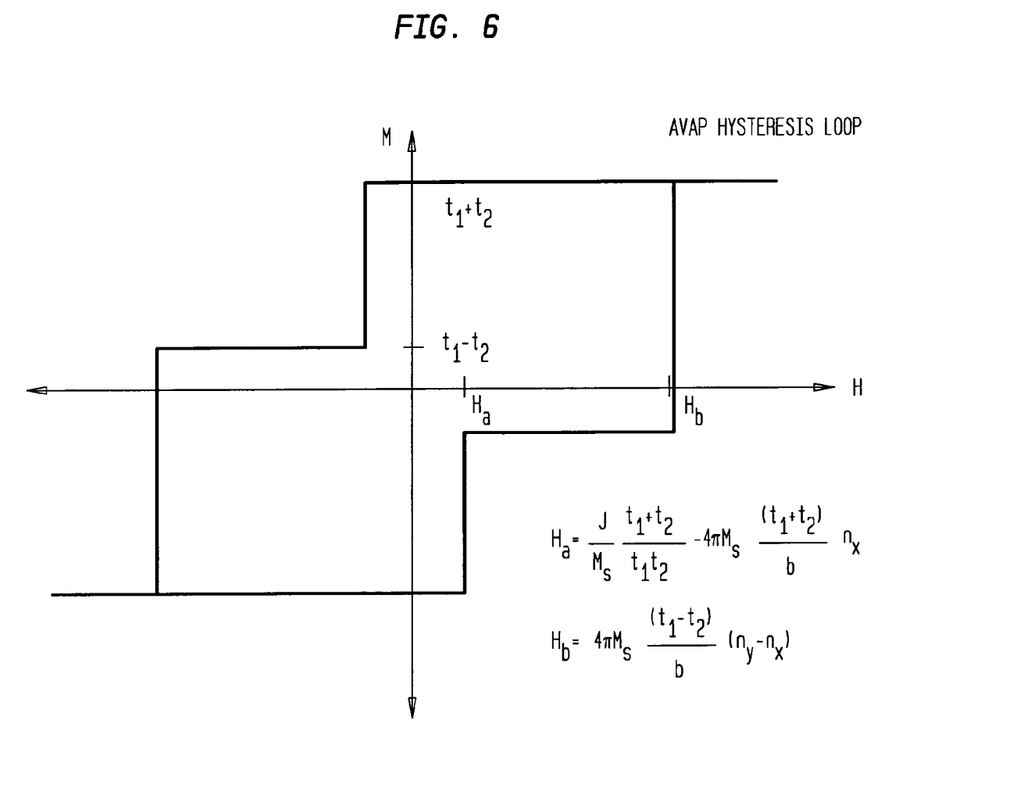
FIG. 6 is a graph showing an AVAP hysteresis loop.

For the case of MRAM, where the two layer thicknesses are unequal, it is still possible to derive the coercivity analytically. The following results are from a solution to the above single domain theory for the case where $t_1 \neq t_2$. FIG. 6 shows an easy axis hysteresis loop of an AVAP bit. Arrows show the direction of magnetization for the two layers. A field is applied in the easy axis direction and the magnetization is calculated as a function of field. First note that in zero field, the two layers are parallel. As a field is applied, first the thin layer switches, making the layers AP. This is a reversible transition; if the field were decreased at this point back to zero, the two layers would return to being parallel. As the field is increased further, the thick layer switches, leaving the layers P again. As the field is returned to zero, the layers remain P. The only stable states in zero field are for the layers to be P. The first transition is given by the equation:

$$H_a = \frac{J}{M_s} \frac{t_1 + t_2}{t_1 t_2} - 4\pi M_s \frac{(t_1 + t_2)}{b} n_x$$

and the second transition is given by $$H_b = 4\pi M_s \frac{(t_1 - t_2)}{b}(n_y - n_x)$$

Figure 7:
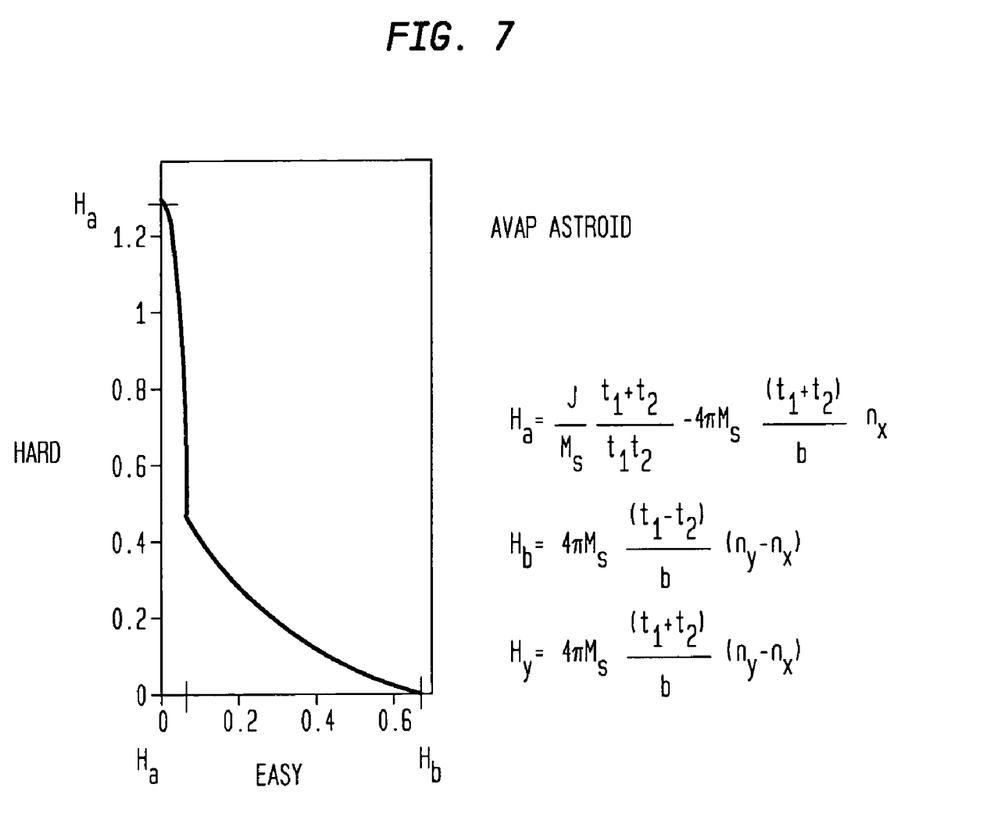
FIG. 7 is a graph of an AVAP astroid.

FIG. 7 shows an AVAP astroid 700. At low hard axis fields the astroid is similar to a Stoner-Wohlfarth astroid, and for larger hard axis fields, the astroid is similar to a via AP astroid. The tip of the astroid along the easy axis is given by $H_b$, and the tip of the astroid along the hard axis is given by the following equation:

$$H_y = 4\pi M_s \frac{(t_1 - t_2)}{b}(n_y - n_x)$$

Achieving Weak Parallel Coupling

There are many ways to get the two magnetic layers weakly parallel coupled. The ideal method is to use an element or alloy for the nonmagnetic metal spacer layer, which provides the correct amount of exchange coupling. There are many such alloys, principally alloys involving at least one of the following elements: Ru, Os, Re, Rh, Mo, Ir, Cr, Cu, and V. Another method is to use a spacer material which gives very large P coupling (for example Ru) and then add a dusting layer to reduce this coupling. As used herein, a very large coupling is one where J>0.5 erg/cm². For example one or both interfaces, or the middle of the Ru layer, could be dusted with a few Angstroms of another material which has no (or much smaller coupling) thus reducing the net coupling. Another method is to have the two magnetic layers separated only by a thin layer of a nonmagnetic material with pinholes in it. The nonmagnetic material serves to largely decouple the two layers, while the pinholes allow the two layers to be P coupled, but only weakly. A different method is to use Neel coupling by making the interfaces rough, however this is often not preferred because the roughness has other deleterious effects. In addition, all of these methods can be trivially modified to have N layers where (N>2) and where all adjacent layers are weakly parallel coupled together.

Figure 8A:
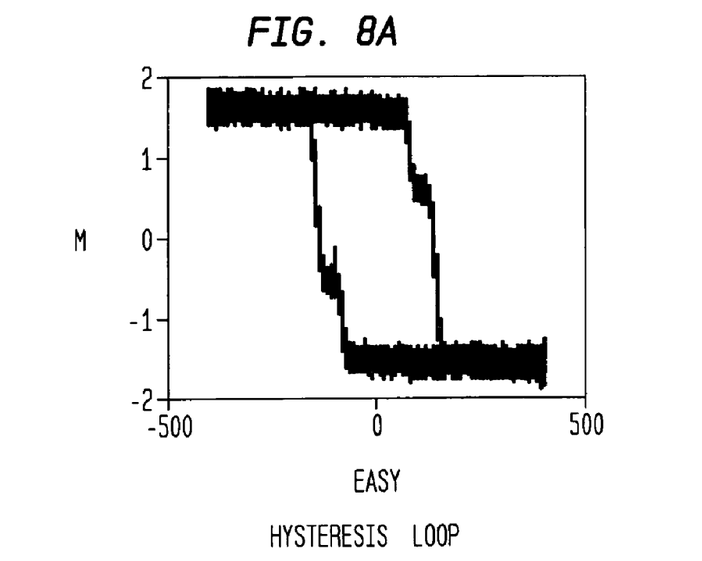
FIG. 8a shows a hysteresis loop based on experimental data.
Figure 8B:
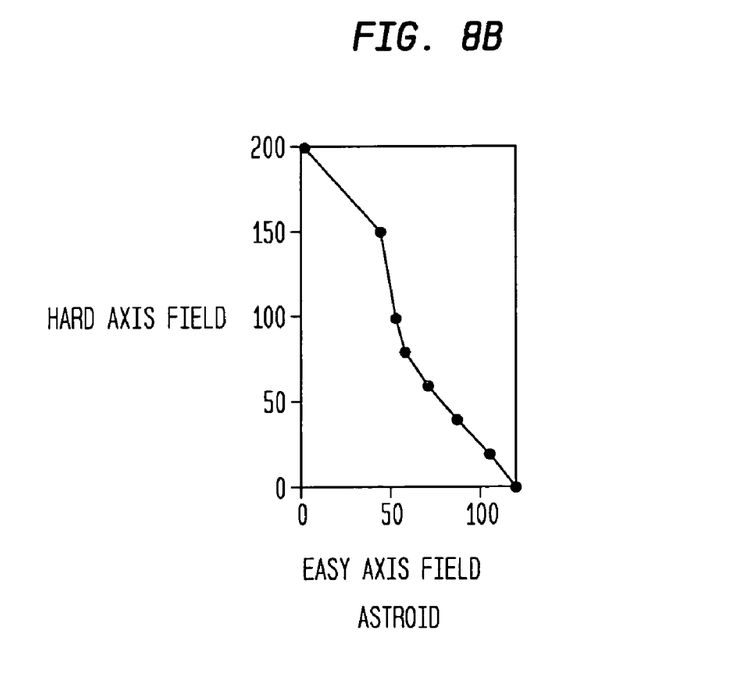
FIG. 8b is a graph of an astroid based on experimental data.
Figure 9:
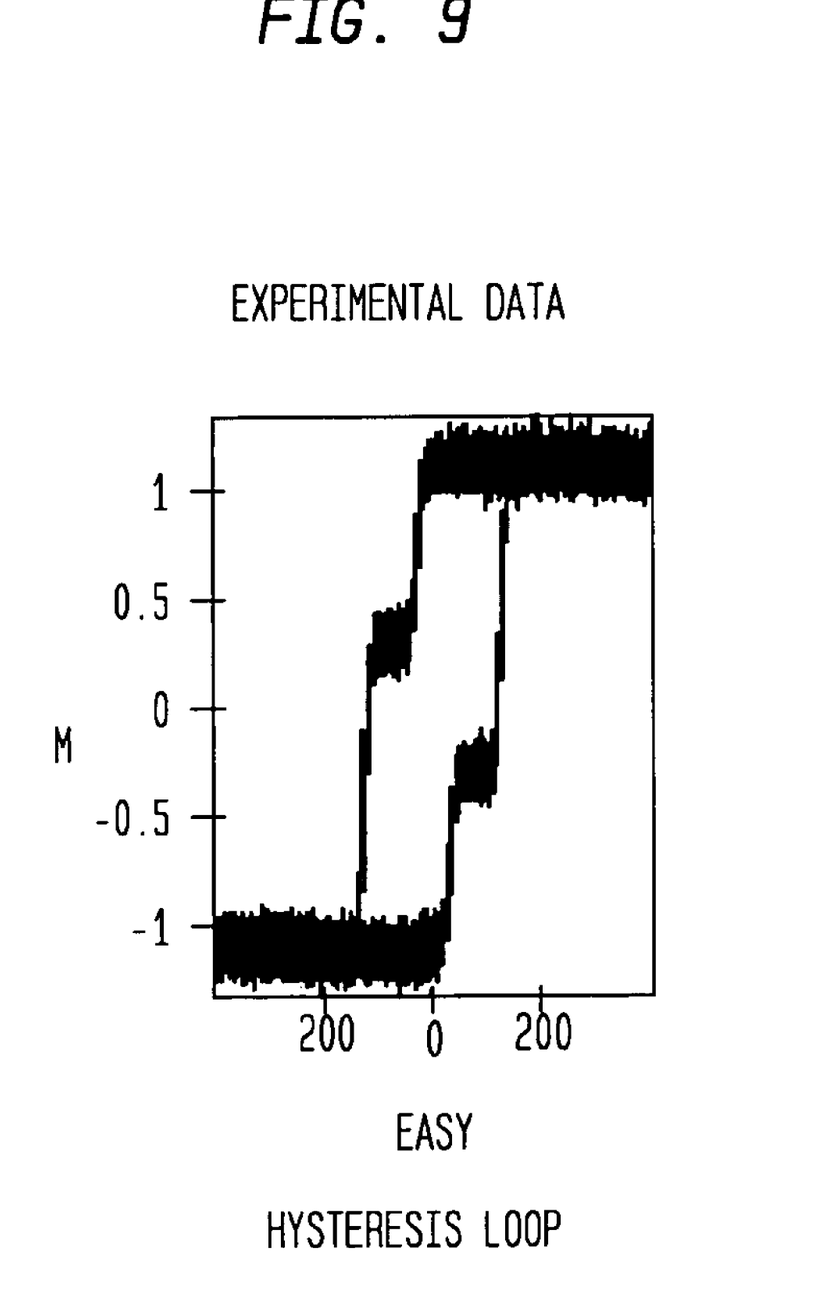
FIG. 9 is a graph of experimental data for a hysteresis loop.

As an example of the dusting method, FIG. 8a shows the hysteresis loop of a structure with composition 30NiFe/ 2CoFeB/16Ru/2CoFeB/70NiFe (all units are Angstroms). Here, CoFeB has very weak coupling across Ru, and NiFe has very strong coupling across Ru. The CoFeB dusting layer thus reduces the net coupling strength. FIG. 8b also shows the astroid for this sample. As another example, FIG. 9 shows the hysteresis loop for a sample with composition 60NiFe/4.5 OsRe/30NiFe. Here the alloy $Os_{25}Re_{75}$ has been chosen to provide the optimal amount of P coupling.

Therefore, while there has been described what is presently considered to be the preferred embodiment, it will be understood by those skilled in the art that other modifications can be made within the spirit of the invention.

I claim:
1. A magnetic memory cell comprising:
   a first magnetic layer;
   a second magnetic layer; and
   a nonmagnetic coupling layer disposed between the first and second layers, wherein the first magnetic layer comprises a first magnetization vector and the second magnetic layer comprises a second magnetization vector, wherein the first and second magnetization vectors are respectively in planes parallel with surfaces of the first and second magnetic layers, and wherein the coupling is strong enough to couple the vectors in parallel pointing in an easy axis direction in zero field and weak enough so that the vectors are coupled non-parallel when an applied field makes the vectors point in an in-plane hard axis direction.

2. The magnetic memory cell of claim 1 wherein the first layer is thicker than the second layer.

3. The cell of claim 1 wherein the first and second layers have substantially equal thicknesses.

4. The cell of claim 2 wherein the first layer is thicker than the second layer by a factor of two or more.

5. The cell of claim 4 wherein the first layer is thicker than the second layer by a factor of two or more and no greater than six.

6. The cell of claim 1 wherein the nonmagnetic spacer layer comprises one of an element or alloy that provides an amount of exchange coupling that results in antiparallel switching of logic state.

7. The cell of claim 6 wherein the element or alloy comprises one of the group consisting of Ru, Os, Re, Rh, Mo, Ir, Cr, Cu, and V.

8. The cell of claim 1 wherein the nonmagnetic spacer layer comprises a spacer material for providing a very large parallel coupling and a dusting layer for reducing the coupling.

9. The cell of claim 8 wherein the spacer material comprises a Ru layer.

10. The cell of claim 9 wherein at least one of the surfaces of the Ru layer is dusted with another material for reducing the coupling between the first and second magnetic layers.

11. The cell of claim 1 wherein the two magnetic layers separated only by a thin layer of a nonmagnetic material comprising pinholes.

12. A method for coupling a first magnetic layer to a second magnetic layer comprising:
    introducing a nonmagnetic layer disposed between the first and second magnetic layers, wherein the first magnetic layer comprises a first magnetization vector and the second magnetic layer comprises a second magnetization vector, wherein the first and second magnetization vectors are respectively in planes parallel with surfaces of the first and second magnetic layers, and wherein the coupling is strong enough to couple the vectors in parallel pointing in an easy axis direction in zero field and weak enough so that the vectors are coupled non-parallel when an applied field makes the vectors point in an in-plane hard axis direction.

13. The method of claim 12 further comprising providing first and second layers having substantially equal thicknesses.

14. The method of claim 12 further comprising providing first and second layers wherein the first layer is thicker than the second layer by a factor of two or more.

15. The method of claim 12 further comprising providing a first layer that is thicker than the second layer by a factor of two or more and no greater than six.

16. The method of claim 12 further comprising providing a nonmagnetic spacer layer that comprises one of an element or alloy that provides an amount of exchange coupling that results in antiparallel switching of logic state.

17. The method of claim 12 further comprising providing a nonmagnetic spacer layer that comprises a spacer material which gives very large parallel coupling and a dusting layer for reducing the coupling.

18. The method of claim 12 further comprising providing a Ru layer dusted with a few Angstroms of another material that produces a much smaller coupling for reducing the coupling between the first and second magnetic layers.

* * * * *